United States Patent [19]
Brenndoerfer

[11] Patent Number: 5,530,285
[45] Date of Patent: Jun. 25, 1996

[54] LOW-IMPEDANCE SURFACE-MOUNT DEVICE

[75] Inventor: Knut Brenndoerfer, Ismaning, Germany

[73] Assignee: Siemens Aktiengesellschaft, Munich, Germany

[21] Appl. No.: 388,848

[22] Filed: Feb. 15, 1995

[30] Foreign Application Priority Data

Feb. 18, 1994 [EP] European Pat. Off. .............. 94102492

[51] Int. Cl.⁶ .................. H01L 23/52; H01L 23/475; H01L 25/40
[52] U.S. Cl. ................... 257/691; 257/666; 257/664
[58] Field of Search ............................ 257/666, 691, 257/728, 601, 664

[56] References Cited

U.S. PATENT DOCUMENTS

| | | | |
|---|---|---|---|
| 4,023,053 | 5/1977 | Shimizu et al. ................... | 257/601 |
| 4,791,473 | 12/1988 | Phy .................................. | 257/728 |
| 5,057,805 | 10/1991 | Kadowski ......................... | 257/666 |
| 5,155,575 | 10/1992 | Zimmermann . | |

FOREIGN PATENT DOCUMENTS

| | | | |
|---|---|---|---|
| 0396152 | 11/1990 | European Pat. Off. ............ | 257/728 |
| 0457985A1 | 11/1991 | European Pat. Off. . | |

OTHER PUBLICATIONS

*Japanese Patent Abstracts*, vol. 5, No. 63, "Semiconductor Device", H. Tetsuya, Jul. 2, 1981.

Primary Examiner—Sara W. Crane
Assistant Examiner—S. V. Clark
Attorney, Agent, or Firm—Hill, Steadman & Simpson

[57] ABSTRACT

A SMD with an RF semiconductor chip (1) encapsulated in a plastic housing is provided. The device has at least one active RF component or an integrated RF circuit with terminal locations, these being contacted by bond wires (4) in the interior of the housing to interconnects of a system carrier (2, 3) that form the outer terminals, the semiconductor chip to be secured on the system carrier. The housing is cost-beneficial and has good RF properties even at extremely high frequencies, e.g., above 2.4 GHz. The system carrier (2, 3) is formed as a co-planar three-band stripline composed of at least one inner RF conductor (3) and outer conductors (7) proceeding at a lateral spacing therefrom which serve as ground terminal. The outer conductors (7) form a planar connection in the housing interior on which the semiconductor chip (1) is secured lying opposite the end of the inner RF conductor (3).

12 Claims, 1 Drawing Sheet

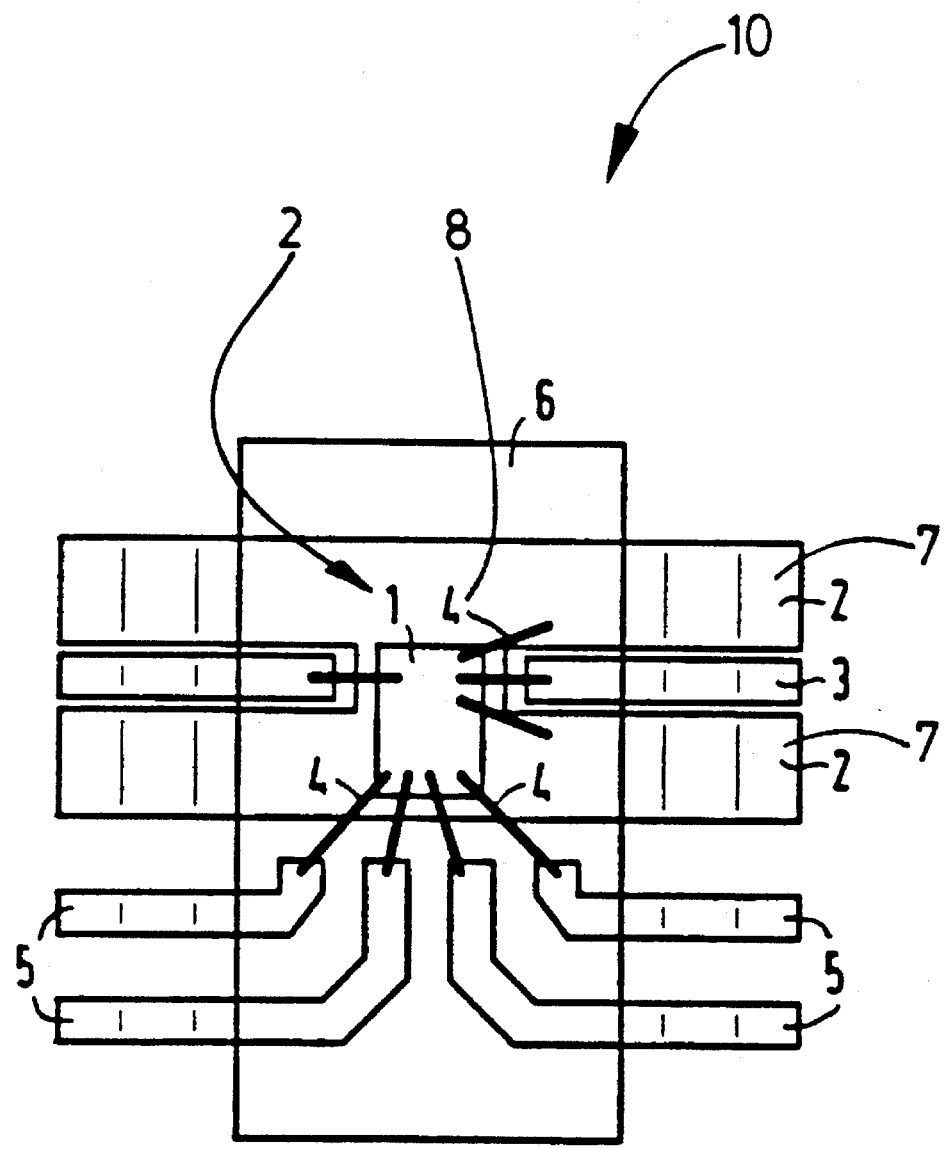

LOW-IMPEDANCE SURFACE-MOUNT DEVICE

BACKGROUND

The present invention is generally relates to a surface-mount device ("SMD") which encapsulates a semiconductor chip. More particularly, the present invention relates to such a SMD having at least one active RF component or an integrated RF circuit with RF terminal locations contacted by bond wires within an interior of a housing to interconnects of a system carrier. The system carrier has a ground platform on which the semiconductor chip is mounted, the ground platform forming outer terminals.

SMD's with plastic housings are generally known for semiconductor chips with a discrete semiconductor component or an integrated circuit (IC). The chip is glued or eutectic bonded to a metallic system carrier, what is referred to as a leadframe, namely on a central part or island thereof given standard components or, respectively, standard ICs, and wires are bonded to the chip. The chip is also completely enveloped with a plastic molding compound in an injection molding process such that only the ends of the system carrier serving as outer terminals project therefrom.

Active high-frequency components such as, for example, silicon bipolar transistors, silicon ICs, GaAs MMICs (monolithic microwave circuits) are usually mounted in a plastic SMD housing for cost reasons. As the frequency increases, the properties of the RF components are negatively influenced to a greater degree by the housing. In particular, the new module radio telephone fields given frequencies of 1.8 GHz and given frequencies of 2.4 GHz and higher in future require cost-beneficial plastic housings having good RF properties for the active RF components in transmitters and receivers. In transmitter units, the thermal conductivity of the leadframe also plays a part since high dissipated powers must be eliminated in some applications.

Until now, RF housings were constructed as small as possible in order to minimize the mass inductances. Given that frequencies are becoming higher and given the introduction of SMD technology, problems have been encountered in further miniaturization of the housing since relatively large chips must also be packaged. As an attempt to then improve the ground, a plurality of pins and pins adjacent the RF terminals (housing terminals) have been applied to ground. Although this configuration improves the grounding conditions and provides additional RF shielding, the characteristic impedance of that arrangement becomes so high because of the usually great spacings between the pins, however, that a great transformation occurs. Moreover, the conventional ground-conducting terminals are just as narrow as the RF terminal, so that a true, low-impedance waveguide does not arise.

SUMMARY OF THE INVENTION

The object of the invention is to create an economically manufacturable plastic SMD housing that still provides good RF properties even at extremely high frequencies, e.g., frequencies above 2.4 GHz. In other words, the present invention provides a SMD with an impedance generally matched to RF input to maximize power transmission and limit RF reflections at high frequencies.

In a plastic SMD housing of the species initially cited, this object is inventively achieved in that the system carrier is fashioned as a co-planar three-band stripline composed of at least one inner RF conductor and outer ground conductors that are parallel to and laterally spaced from the RF inner conductor. Also, the outer conductors comprise a planar connection in the interior of the housing on which the semiconductor chip is secured lying opposite the end of the inner RF conductor.

The inner RF conductor thereby advantageously forms a low-impedance waveguide between an outer housing terminal part and its end lying opposite the semiconductor chip having a characteristic impedance of less than 100 ohms.

The outer conductors serving as ground terminals in the system carrier fashioned as a co-planar stripline are advantageously wider than the inner RF conductor or conductors. The semiconductor chip is contacted to the system carrier by at least three bond wires per According to an embodiment of the invention, the system carrier fashioned as a co-planar three-band strip line comprises additional interconnects that serve as dc voltage terminals.

Furthermore, depending on the desired application and kind of mounting, respectively, the ends of the interconnects of the system carrier projecting from the housing can be expediently fashioned straight or crimped. For example, straight terminals are expedient when the mounting of the housing body is to ensue in a printed circuit board clearance.

The advantages of the invention are notably achieved wherein the system carrier is fashioned as a symmetrical, co-planar three-band line. This RF line arrangement is a stripline having a finite width and thickness and two metalization planes laterally distanced and slightly spaced and having a theoretically infinite expanse, these being applied to ground.

The RF wave is guided in conformity with the characteristic impedance in the co-planar line given appropriate dimensions. The RF wave is guided therein even for low impedance, whereby the fields propagate in two slots between inner conductor and ground surfaces. Given small slot widths, low-impedances of less than 75 ohms are possible. The characteristic impedance derives due to the capacitor coat arising in the narrow slots. Since the fields concentrate in the slots, an infinitely broad ground surface is not necessary in practice. The ground guidance (the two outer conductors), however, should expediently have a greater width than the middle conductor (the inner RF conductor).

Due to the fashioning of the terminals as co-planar lines, the connection between the chip and printed circuit board can ensue in conformity with characteristic impedance in a low-impedance RF system (conventionally 50 ohms). This has the advantage that no transformations occur in the housing, and that the ground potential is conducted together with the RF-guiding inner conductor up to the chip, i.e. up to the location where an optimum ground potential is necessary.

In the realization of a co-planar housing, the slot width (which may vary depending on the leadflame thickness and on the desired width of the inner conductor) should be dimensioned such that a characteristic impedance of, for example, 50 ohms derives in the housing, i.e. with plastic fill. This generally increases beyond the plastic, i.e., in air outside the housing, although this does not technologically represent any problem. For problematical applications, the slots between inner conductor and ground surface beyond the plastic can be narrowed to achieve the desired characteristic impedance, e.g., 50 ohms, there as well.

Additional features and advantages of the present invention are described in, and will be apparent from, the detailed description of the presently preferred embodiments as well as from the drawing.

BRIEF DESCRIPTION OF THE DRAWING

The FIGURE illustrates a top plan view of a SMD according to the present invention.

DETAILED DESCRIPTION OF THE PRESENTLY PREFERRED EMBODIMENTS

As illustrated in the FIGURE, a SMD 10 includes a plastic housing 6 which encapsulates a semiconductor chip 1. The housing 6 is a suitable plastic material, for example a duroplastic synthetic. The semiconductor chip 1, for example a Si or GaAs chip, has at least one active component or one integrated RF circuit having terminal locations, referred to as pads.

The SMD includes a system carrier which includes a ground platform 2 and inner RF terminals 3. The ground platform 2 forms at least two outer terminals 7 that extend from the housing 6. Adjacent outer terminals 7 are parallel to each other. An inner RF terminal 3 is positioned between adjacent outer terminals 7. The pads of the chip 1 are contacted by bond wires 4 in the interior of the housing 6 to the system carrier, particularly to the outer 7 and the inner terminals 3. The outer terminals 7 serve as ground terminals for the chip 1.

The ground platform 2 of the system carrier has a planar central portion 8 which contiguously joins the outer terminals 7. The semiconductor chip 1 is secured on this central portion of the ground platform 2 of the system carrier between opposing ends of the two inner RF conductors 3. In the embodiment illustrated, the ground platform 2 is generally H-shaped. As shown, the ground platform 2 forms two outer terminals 7 at each end, a cutout defining a separation between adjacent terminals. The central portion 8 is at the middle portion of the "H."

The system carrier, i.e., the ground platform 2 and the inner terminals 3, are made of a metal or metal alloy. Furthermore, adjacent outer terminals 7 and the respective inner terminals 3 are fashioned as a co-planar, three-band strip line. In the illustrated embodiment, two inner RF conductors 3 are provided lying opposite one another. The outer terminals 7 proceed alongside the inner RF conductors with a lateral spacing there, from defined by the cutouts. The inner RF conductors 3 are disposed within cutout portions between the outer conductors 7 of the system carrier member 2 so that the inner conductors 3 are parallel to the outer conductors 7, but spaced therefrom by slots.

For separate dc voltage supply of the active RF components of the semiconductor chip 1, the system carrier 2, 3 fashioned as a co-planar three-band stripline is equipped with additional interconnects in this exemplary embodiment that serve as dc voltage terminals 5.

Understandably, various changes and modifications to the presently preferred embodiments described herein will be apparent to those skilled in the art. Such changes and modifications can be made without departing from the spirit and scope of the present invention and without diminishing its attendant advantages. Therefore, the appended claims are intended to cover such changes and modifications.

What is claimed is:

1. A surface-mount device comprising:

a ground platform with at least two outer terminals extending in a parallel manner, said ground platform having a center portion joining said outer terminals;

at least one RF component secured to said center portion, said RF component having contact locations;

a housing covering said center portion and said RF component;

at least one inner RF terminal, each inner RF terminal being disposed between and spaced from adjacent outer terminals in a parallel manner to form therewith a co-planar three-band stripline, each inner RF terminal being connected to a respective contact location on said RF component within said housing, each inner RF conductor extending from said housing; and bond wires connecting said contact locations to respective outer terminals and inner RF terminals, the bond wires being covered by the housing;

wherein said ground platform anti said inner RF terminal have relative dimensions such that said inner RF terminal forms a low-impedance waveguide from outside said housing to its end proximate to said RF component.

2. The device according to claim 1 wherein said inner RF terminal has a characteristic impedance of less than 100 ohms.

3. The device according to claim 1 wherein said outer terminals are broader than the associated inner RF terminal.

4. The device according to claims 1 further comprising:

dc voltage terminals connected to said RF component and extending from said housing.

5. The device according to claims 1 wherein ends of the system carrier that project from the housing are straight.

6. A surface-mount device comprising:

a ground platform having a planar portion and at least two parallel extending ground terminals;

at least one RF terminal for receiving an RF signal, one RF terminal being disposed between adjacent ground terminals;

a semiconductor chip secured to said planar portion, said semiconductor chip having a plurality of contact pads respectively connected to ground platform and each RF terminal; and a plastic housing protecting said chip, portions of said ground terminals and said RF terminal extending therefrom;

wherein each inner RF terminal and adjacent ground terminals are arranged in a coplanar spaced-apart parallel relation and relatively sized so that said inner RF terminal has a characteristic impedance within said housing generally matched to an impedance of said RF signal.

7. The device according to claim 6 wherein said characteristic impedance is less than 100 ohms.

8. The device according to claim 6 wherein said ground platform is generally H-shaped, defining a pair of parallel ground terminals at each end.

9. The device according to claim 6 further comprising:

a plurality of dc voltage terminals connected to respective contact pads on said chip, said voltage terminals extending from said housing.

10. A surface-mount device comprising:

a ground platform with at least two outer terminals extending in a parallel manner, said ground platform having a center portion joining said outer terminals;

at least one RF component secured to said center portion, said RF component having contact locations;

a housing covering said center portion and said RF component;

at least one inner RF terminal, each inner RF terminal being disposed between and spaced from adjacent outer terminals in a parallel manner to form therewith a co-planar three-band stripline, each inner RF terminal being connected to a respective contact location on said RF component within said housing, each inner RF conductor extending from said housing;

bond wires connecting said contact locations to respective outer terminals and inner RF terminals, the bond wires being covered by the housing; and dc voltage terminals connected to said RF component and extending from said housing.

11. The device according to claim 10 wherein said outer terminals are broader than the associated inner RF terminal.

12. The device according to claim 10 wherein ends of the system carrier that project from the housing are straight.

\* \* \* \* \*